(12) United States Patent
Chen et al.

(10) Patent No.: US 10,248,164 B2
(45) Date of Patent: Apr. 2, 2019

(54) CHIP ON FILM, FLEXIBLE DISPLAY APPARATUS HAVING THE SAME, AND FABRICATING METHOD THEREOF

(71) Applicant: BOE TECHNOLOGY GROUP CO., LTD., Beijing (CN)

(72) Inventors: Liqiang Chen, Beijing (CN); Chen Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/543,686

(22) PCT Filed: Jul. 11, 2016

(86) PCT No.: PCT/CN2016/089620
§ 371 (c)(1),
(2) Date: Jul. 14, 2017

(87) PCT Pub. No.: WO2018/010059
PCT Pub. Date: Jan. 18, 2018

(65) Prior Publication Data
US 2018/0210505 A1  Jul. 26, 2018

(51) Int. Cl.
*H05K 1/02* (2006.01)
*G06F 1/16* (2006.01)
(Continued)

(52) U.S. Cl.
CPC ............ *G06F 1/1652* (2013.01); *G09F 9/301* (2013.01); *H01L 27/3276* (2013.01);
(Continued)

(58) Field of Classification Search
CPC ... G06F 1/1652; G09F 9/301; H01L 27/3276; H01L 2251/5338; H04M 1/0268; H05K 1/028
(Continued)

(56) References Cited

U.S. PATENT DOCUMENTS 9,723,712 B2 * 8/2017 Cho ................. H05K 1/028
2008/0088768 A1 4/2008 Kohno
(Continued)

FOREIGN PATENT DOCUMENTS

CN 101165553 A 4/2008
CN 105118386 A 12/2015
(Continued)

OTHER PUBLICATIONS

First Office Action in the Chinese Patent Application No. 201610542697.4, dated Mar. 30, 2018; English translation attached.
(Continued)

*Primary Examiner* — Tremesha S Willis
(74) *Attorney, Agent, or Firm* — Intellectual Valley Law, P.C.

(57) ABSTRACT

The present application discloses a flexible display apparatus bendable along a bending direction extending from a first portion of the flexible display apparatus to a second portion of the flexible display apparatus; the first portion bent towards the second portion when the flexible display apparatus is bent along the bending direction; including a plurality of chip on films arranged extending from the first portion to the second portion; each of the plurality of chip on films having a base film and an integrated circuit chip on the base film; and a flexible display panel connected to the plurality of chip on films. A longitudinal direction of the integrated circuit chip is substantially perpendicular to the bending direction.

15 Claims, 5 Drawing Sheets

(51) Int. Cl.
 H04M 1/02 (2006.01)
 G09F 9/30 (2006.01)
 H01L 27/32 (2006.01)
(52) U.S. Cl.
 CPC .......... *H04M 1/0268* (2013.01); *H05K 1/028* (2013.01); *H01L 2251/5338* (2013.01)
(58) Field of Classification Search
 USPC ........................................................ 361/749
 See application file for complete search history.

(56) References Cited

U.S. PATENT DOCUMENTS

| | | |
|---|---|---|
| 2015/0173176 A1 | 6/2015 | Lee |
| 2016/0088726 A1 | 3/2016 | Jeon |
| 2017/0255043 A1 | 9/2017 | Hsiao et al. |

FOREIGN PATENT DOCUMENTS

| | | |
|---|---|---|
| CN | 105278185 A | 1/2016 |
| CN | 105448252 A | 3/2016 |
| CN | 105931572 A | 9/2016 |
| CN | 205910958 U | 1/2017 |

OTHER PUBLICATIONS

International Search Report & Written Opinion dated Apr. 11, 2017, regarding PCT/CN2016/089620.

\* cited by examiner

Forming an input wiring on a base film including a plurality of input wires, the plurality of input wires extending from a chip mount region along a first direction, bending towards an input bonding region, and extending along a second direction different from the first direction into the input bonding region.

↓

Forming an output wiring on the base film having a plurality of output wires, the plurality of output wires extending from the chip mount region along a third direction, bending towards an output bonding region, and extending along a fourth direction different from the third direction into the output bonding region.

↓

Connecting an integrated circuit chip to the input wiring and the output wiring so that the input bonding region and the output bonding region are substantially on two opposite sides of the chip on film, a lengthwise direction of the integrated circuit chip being substantially perpendicular to the two opposite sides.

FIG. 4

CHIP ON FILM, FLEXIBLE DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/089620 filed Jul. 11, 2016, the contents of which are incorporated by reference in the entirety.

TECHNICAL FIELD

The present invention relates to display technology, more particularly, to a chip on film, a flexible display apparatus having the same, and fabricating method thereof.

BACKGROUND

A flexible display apparatus is a bendable or deformable display apparatus having a flexible display panel. Examples of flexible display apparatuses include a flexible organic light emitting display (OLED) device, a flexible electrophoretic display (EPD) device, and a flexible liquid crystal display (LCD) device. As a new generation display apparatus, the flexible display apparatus is thinner and lighter, having high contrast, high responsiveness, and high brightness. It also provides full color and a wide viewing angle. The flexible display apparatus has found a wide range of applications in mobiles phones, personal digital assistance (PDAs), digital cameras, on-board displays, notebook computers, on-wall televisions, as well as various military applications. A flexible display apparatus includes a flexible array substrate. A base substrate of the flexible array substrate can be made of flexible material such as plastic.

SUMMARY

In one aspect, the present invention provides a flexible display apparatus bendable along a bending direction extending from a first portion of the flexible display apparatus to a second portion of the flexible display apparatus; the first portion bent towards the second portion when the flexible display apparatus is bent along the bending direction; comprising a plurality of chip on films arranged extending from the first portion to the second portion; each of the plurality of chip on films comprising a base film and an integrated circuit chip on the base film; and a flexible display panel connected to the plurality of chip on films; wherein a longitudinal direction of the integrated circuit chip is substantially perpendicular to the bending direction.

Optionally, each of the plurality of chip on films comprises an input wiring and an output wiring connected to the integrated circuit chip; the flexible display apparatus further comprises a printed circuit board connected to the input wiring; and a flexible display panel connected to the output wiring; and the chip on film further comprises an input bonding region for bonding with the printed circuit board and an output bonding region for bonding with the flexible display panel; the input bonding region and the output bonding region are substantially on two opposite sides of the chip on film; the longitudinal direction of the integrated circuit chip being substantially perpendicular to the two opposite sides.

Optionally, the input wiring comprises a plurality of input wires connecting the integrated circuit chip and the printed circuit board; the plurality of input wires extending from the integrated circuit chip along a first direction, bending towards the input bonding region, and extending along a second direction different from the first direction into the input bonding region; and the output wiring comprises a plurality of output wires connecting the integrated circuit chip and the flexible display panel; the plurality of output wires extending from the integrated circuit chip along a third direction, bending towards the output bonding region, and extending along a fourth direction different from the third direction into the input bonding region.

Optionally, the first direction and the third direction are substantially perpendicular to the longitudinal direction of the integrated circuit chip, and the second direction and the fourth direction are substantially parallel to the longitudinal direction of the integrated circuit chip.

Optionally, the chip on film comprises a row of a plurality of through holes in an area proximal to the output bonding region.

Optionally, the output bonding region is mounted on a first surface of the flexible display panel, and the chip on film is folded along a line formed by the row of the plurality of through holes so that the integrated circuit chip, the input bonding region, and the printed circuit board are mounted on a second surface of the flexible display panel opposite to the first surface.

Optionally, the row of the plurality of through holes is substantially aligned in a direction substantially perpendicular to the longitudinal direction of the integrated circuit chip.

Optionally, the flexible display apparatus is curving around a curving axis, the plurality of chip on films arranged surrounding the curving axis when the flexible display apparatus is curved around the curving axis, and the longitudinal direction of the integrated circuit chip is substantially parallel to the curving axis.

In another aspect, the present invention provides a chip on film comprising a base film, an integrated circuit chip on the base film, an input wiring and an output wiring connected to the integrated circuit chip; wherein the chip on film has an input bonding region for bonding with a printed circuit board and an output bonding region for bonding with a flexible display panel; the input bonding region and the output bonding region are substantially on two opposite sides of the chip on film, a longitudinal direction of the integrated circuit chip being substantially perpendicular to the two opposite sides.

Optionally, the input wiring comprises a plurality of input wires extending from the integrated circuit chip along a first direction, bending towards the input bonding region, and extending along a second direction different from the first direction into the input bonding region; and the output wiring comprises a plurality of output wires extending from the integrated circuit chip along a third direction, bending towards the output bonding region, and extending along a fourth direction different from the third direction into the input bonding region.

Optionally, the first direction and the third direction are substantially perpendicular to the longitudinal direction of the integrated circuit chip, and the second direction and the fourth direction are substantially parallel to the longitudinal direction of the integrated circuit chip.

Optionally, the chip on film further comprises a row of a plurality of through holes proximal to the output bonding region.

Optionally, the chip on film is foldable along a line formed by the row of the plurality of through holes.

Optionally, the row of the plurality of through holes is substantially aligned in a direction substantially perpendicular to the longitudinal direction of the integrated circuit chip.

In another aspect, the present invention provides a method of fabricating a flexible display apparatus, comprising providing a chip on film comprising a base film, an integrated circuit chip on the base film, an input wiring and an output wiring connected to the integrated circuit chip; wherein the chip on film has an input bonding region for bonding with a printed circuit board and an output bonding region for bonding with a flexible display panel; the input bonding region and the output bonding region are substantially on two opposite sides of the chip on film, a longitudinal direction of the integrated circuit chip being substantially perpendicular to the two opposite sides; and mounting the chip on film to a flexible display panel bendable along a bending direction so that the longitudinal direction of the integrated circuit chip is substantially perpendicular to the bending direction; wherein the bending direction extends from a first portion of the flexible display panel to a second portion of the flexible display panel; the first portion bent towards the second portion when the flexible display panel is bent along the bending direction.

Optionally, the method further comprises mounting the output bonding region on a first surface of the flexible display panel; and mounting the integrated circuit chip and the input bonding region on a second surface of the flexible display panel opposite to the first surface.

Optionally, the chip on film comprises a row of a plurality of through holes in an area proximal to the output bonding region, the method further comprising folding the chip on film along a line formed by the row of the plurality of through holes.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In a conventional flexible display apparatus, the longitudinal direction of the integrated circuit chip of a chip on film connected to the conventional flexible display apparatus is substantially parallel to the bending direction, e.g., substantially parallel to the curvature direction of the flexible display apparatus when bent. Thus, the orientation of the integrated circuit chip vis-à-vis the bending direction of the flexible display apparatus significantly limits the degree to which the flexible display apparatus can be bent. This problem becomes even more severe for a particular type of flexible display apparatus, i.e., a rollable display apparatus.

The present disclosure provides a novel chip on film, a flexible display apparatus having the same, and fabricating method thereof that obviate one or more of the problems due to limitations and disadvantages of the conventional flexible display apparatus. In one aspect, the present disclosure provides a flexible display apparatus bendable along a bending direction, having a plurality of chip on films and a flexible display panel connected to the plurality of chip on films. In some embodiments, the flexible display apparatus is bendable along a bending direction extending from a first portion of the flexible display apparatus to a second portion of the flexible display apparatus; the first portion bent towards the second portion when the flexible display apparatus is bent along the bending direction. The plurality of chip on films are arranged extending from the first portion to the second portion, each of the plurality of chip on films including a base film and an integrated circuit chip on the base film. Optionally, the first portion is a first side of the flexible display apparatus, and the second portion is a second side of the flexible display apparatus.

The flexible display apparatus and the flexible display panel may have any appropriate shape, examples of which include, but are not limited to, a square shape, a rectangular shape, a parallelogram shape, a circle shape, an elliptical shape, an oval shape, and a hexagon shape. For example, the flexible display apparatus may be of a rectangular shape. Optionally, the bending direction is a direction extending from a first portion (e.g., a first side) of the rectangular flexible display apparatus towards a second portion (e.g., a second side) of the flexible display apparatus, the first portion bent towards the second portion when the flexible display apparatus is bent along the bending direction, e.g., from a flat configuration to a curved configuration. Optionally, the first side and the second side are two short sides of the rectangular flexible display apparatus, and the bending direction is the longitudinal direction of the rectangular flexible display apparatus.

In some embodiments, the plurality of chip on films connect the flexible display panel to a printed circuit board (e.g., a flexible printed circuit board). Moreover, the chip on film is also bendable along the bending direction. Optionally, the chip on film includes a base film, an integrated circuit chip on the base film, an input wiring pattern and an output wiring pattern connected to the integrated circuit chip. Specifically, a longitudinal direction of the integrated circuit chip is substantially perpendicular to the bending direction. For example, when the flexible display apparatus is curved, the longitudinal direction of the integrated circuit chip is substantially perpendicular to the curvature direction of the curved flexible display apparatus.

As used herein, the term "longitudinal direction" refers to a direction parallel to a long side (e.g., the longest side) of an object or a surface. As used herein, the term "lateral direction" refers to a direction parallel to a short side (e.g., the shortest side) of an object or a surface. As used herein, the term "substantially perpendicular" means that an angle is in the range of approximately 45 degrees to approximately 135 degrees, e.g., approximately 85 degrees to approximately 95 degrees, approximately 80 degrees to approximately 100 degrees, approximately 75 degrees to approximately 105 degrees, approximately 70 degrees to approximately 110 degrees, approximately 65 degrees to approximately 115 degrees, approximately 60 degrees to approximately 120 degrees. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

Figure 1A:
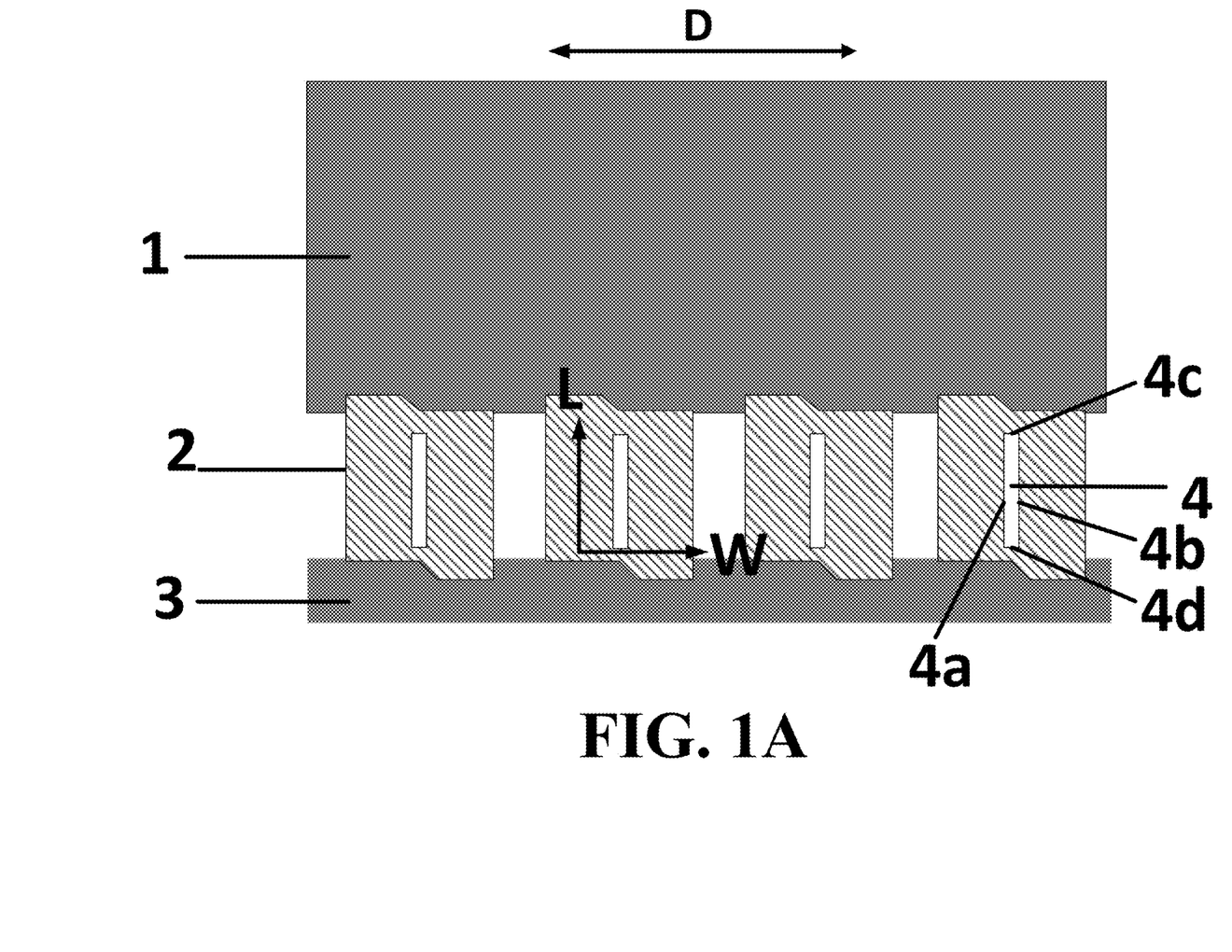
FIG. 1A is a diagram illustrating a plan view of the structure of a flexible display apparatus in some embodiments.

FIG. 1A is a diagram illustrating a plan view of the structure of a flexible display apparatus in some embodiments. Referring to FIG. 1A, the flexible display apparatus in the embodiment includes a flexible display panel 1, a chip on film 2, and a flexible printed circuit board 3. As shown in FIG. 1A, the flexible display apparatus is bendable along a bending direction D. The chip on film 2 includes an integrated circuit chip 4. The integrated circuit chip 4 in the embodiment has an elongated shape, having two long sides 4a and 4b, and two short sides 4c and 4d. The longitudinal direction L of the integrated circuit chip 4 is substantially perpendicular to the two short sides 4c and 4d, and substantially parallel to two long sides 4a and 4b. The lateral direction W of the integrated circuit chip 4 is substantially parallel to the two short sides 4c and 4d, and substantially perpendicular to the two long sides 4a and 4b. For example, the longitudinal direction L of the integrated circuit chip 4 is substantially perpendicular to the bending direction D.

Figure 1B:
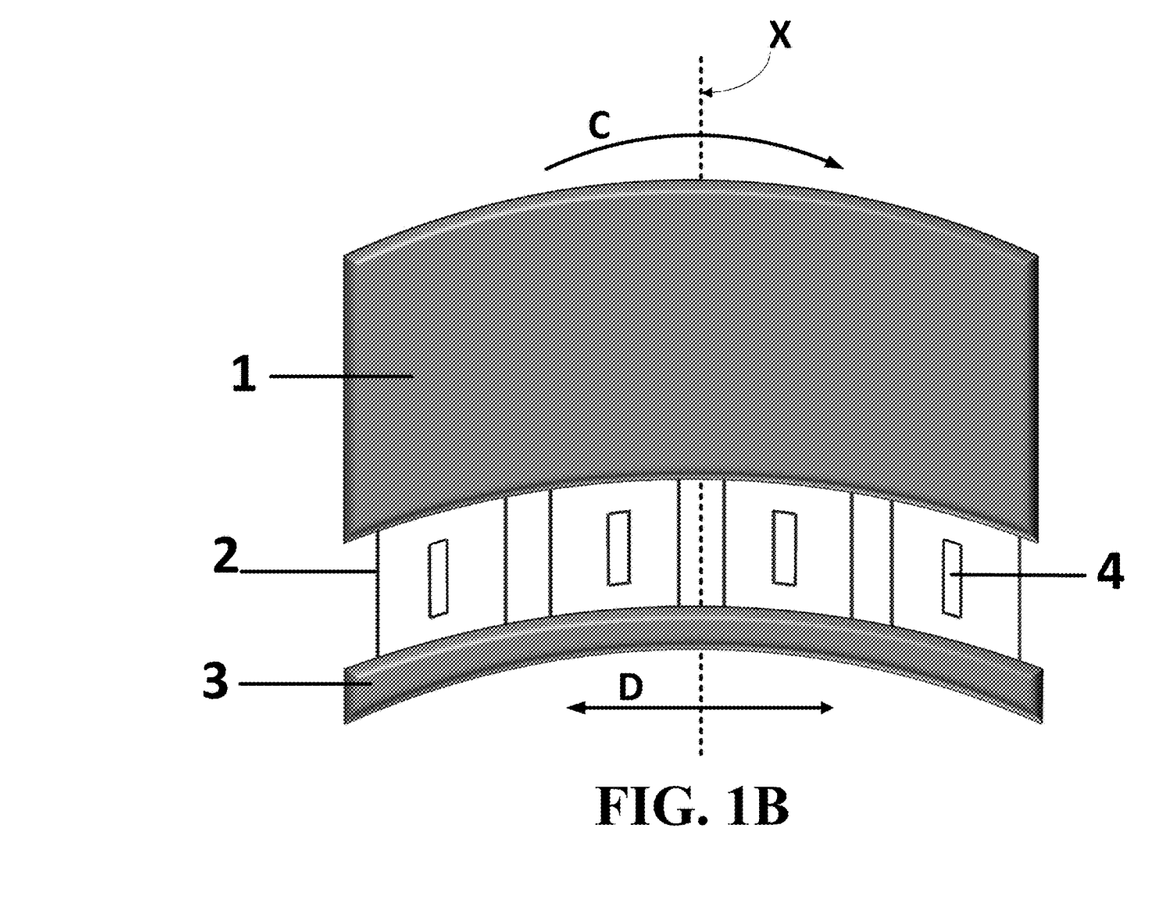
FIG. 1B is a diagram illustrating a perspective view of the structure of a flexible display apparatus in a curved state in some embodiments.

FIG. 1B is a diagram illustrating a perspective view of the structure of a flexible display apparatus in a curved state in some embodiments. Referring to FIG. 1B, the flexible display apparatus in the embodiment includes a flexible display panel 1, a chip on film 2, and a flexible printed circuit board 3. As shown in FIG. 1B, the flexible display apparatus is bent along the bending direction D, resulting in a curved flexible display apparatus. The curved flexible display apparatus has a curvature. The chip on film 2 includes an integrated circuit chip 4. The longitudinal direction of the integrated circuit chip 4 is substantially perpendicular to the curvature direction C of the flexible display apparatus.

Referring to FIG. 1B, the flexible display apparatus is curved around an axis X. As shown in FIG. 1B, the longitudinal direction of the integrated circuit chip 4 is substantially parallel to the axis X. Accordingly, in some embodiments, the present disclosure provides a flexible display apparatus curving around a curving axis, the plurality of chip on films arranged surrounding the curving axis when the flexible display apparatus is curved, and the longitudinal direction of the integrated circuit chip is substantially parallel to the curving axis.

Figure 2A:
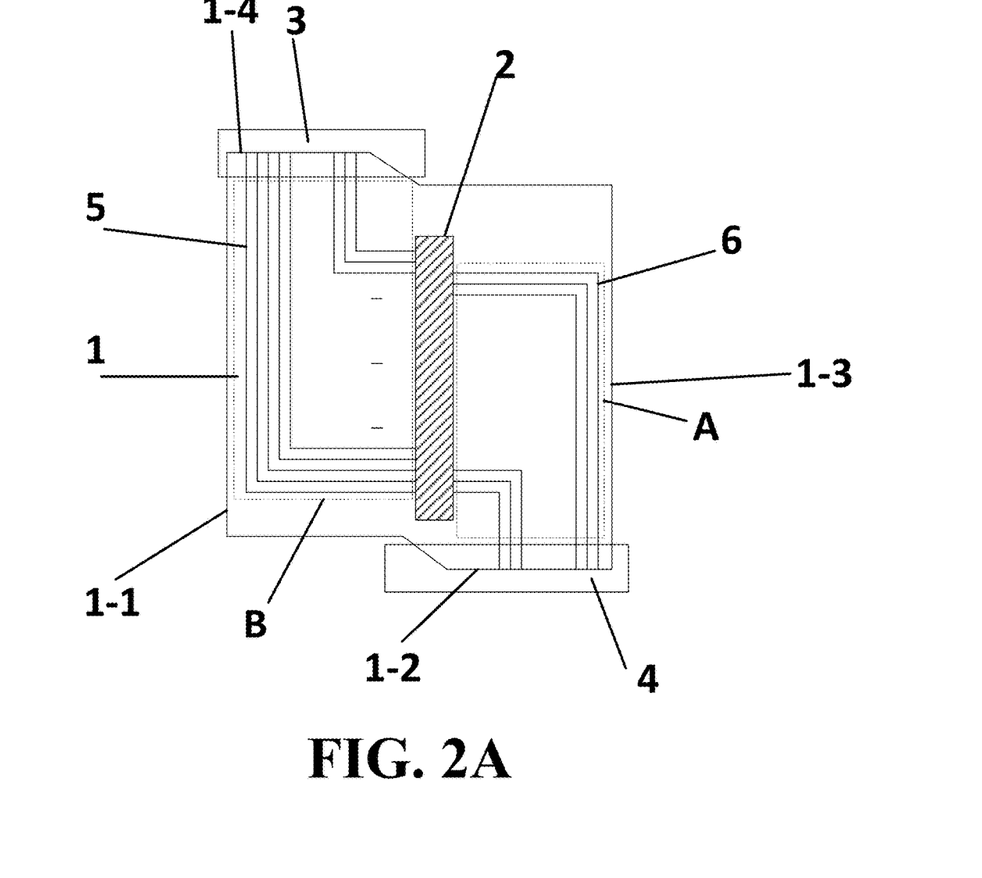
FIG. 2A is a diagram illustrating the structure of a chip on film in some embodiments.

FIG. 2A is a diagram illustrating the structure of a chip on film in some embodiments. Referring to FIG. 2A, the chip on film in the embodiment includes an integrated circuit chip 4, an input wiring pattern A, and an output wiring pattern B. The input wiring pattern A is connected to a printed circuit board, and the output wiring pattern B is connected to a flexible display panel.

The chip on film in FIG. 2A has a first side 1-1, a second side 1-2 connected to the first side 1-1, a third side 1-3 connected to the second side 1-2 and opposite to the first side 1-1, and a fourth side 1-4 connected to the third side 1-3 and the first side 1-1, the fourth side 1-4 being opposite to the second side 1-2.

The chip on film in FIG. 2A further includes an input bonding region 40 along the second side 1-2 of the chip on film for bonding with the printed circuit board, and an output bonding region 30 along the fourth side 1-4 for bonding with the flexible display panel. As shown in FIG. 2A, the input bonding region 40 and the output bonding region 30 are substantially on two opposite sides (e.g., the fourth side 1-4 and the second side 1-2) of the chip on film along the length direction of the integrated circuit chip 4.

Referring to FIG. 2A, the input wiring pattern A includes a plurality of input wires 60 for connecting the integrated circuit chip 4 and the printed circuit board. The plurality of input wires 60 in FIG. 2A extend from the integrated circuit chip along a first direction towards the third side 1-3 of the chip on film, then bend towards the input bonding region 40, and extend along a second direction different from the first direction into the input bonding region 40. Optionally, the first direction is substantially parallel to the lateral direction of the integrated circuit chip and substantially perpendicular to the longitudinal direction of the integrated circuit chip. Optionally, the second direction is substantially parallel to the longitudinal direction of the integrated circuit chip and substantially perpendicular to the lateral direction of the integrated circuit chip.

The output wiring pattern B in FIG. 2A includes a plurality of output wires 50 for connecting the integrated circuit chip 4 and the flexible display panel. The plurality of output wires 50 in FIG. 2A extend film the integrated circuit chip along a third direction towards the first side 1-1 of the chip on film, then bend towards the output bonding region 30, and extend along a fourth direction different from the third direction into the output bonding region 30. Optionally, the third direction is substantially parallel to the lateral direction of the integrated circuit chip and substantially perpendicular to the longitudinal direction of the integrated circuit chip. Optionally, the fourth direction is substantially parallel to the longitudinal direction of the integrated circuit chip and substantially perpendicular to the lateral direction of the integrated circuit chip.

Optionally, the first direction is substantially parallel to the third direction. Optionally, the second direction is substantially parallel to the fourth direction. Optionally, the first direction is substantially perpendicular to the second direction. Optionally, the third direction is substantially perpendicular to the fourth direction.

Figure 2B:
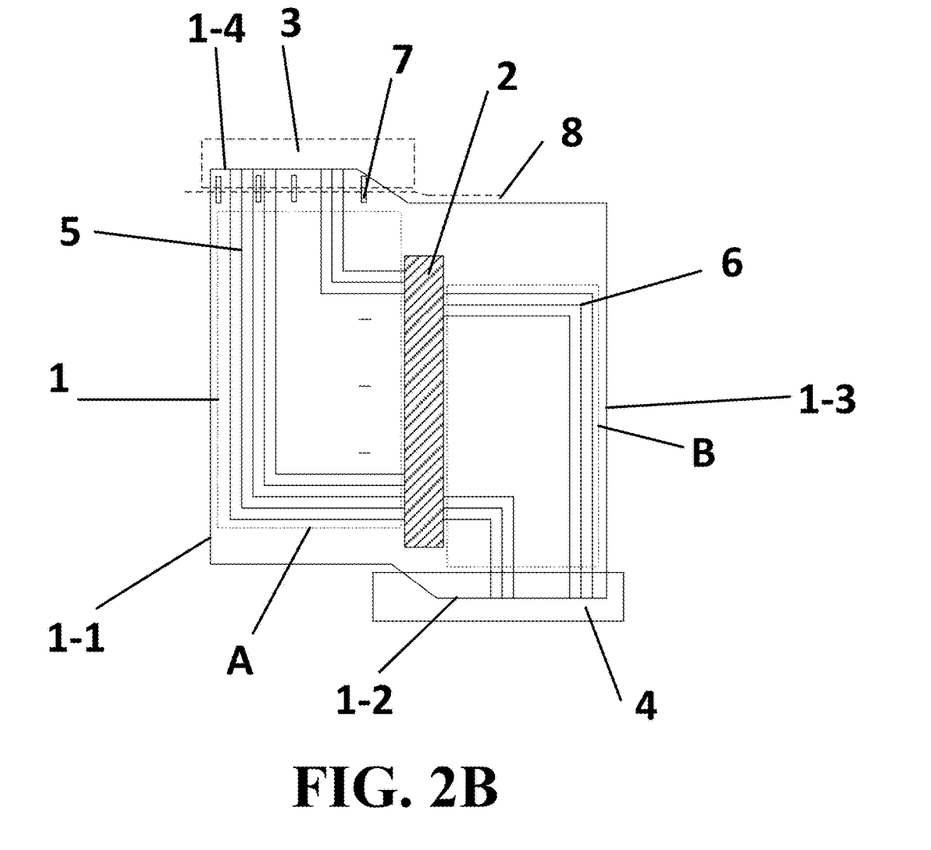
FIG. 2B is a diagram illustrating the structure of a chip on film in some embodiments.

FIG. 2B is a diagram illustrating the structure of a chip on film in some embodiments. Referring to FIG. 2B, the chip on film in the embodiment has a structure similar to that of the chip on film in FIG. 2A except that it further includes a row of a plurality of through holes 7 in an area proximal to the output bonding region 30. The chip on film is foldable along a line formed by the row of the plurality of through holes 7, as indicated by a line 8 extending through the plurality of through holes 7 in FIG. 2B. The physical stress concentrated on the folded region when the chip on film is bent may be dissipated due to the presence of the plurality of through holes 7. Optionally, the line 8 is in a direction substantially perpendicular to the longitudinal direction of the integrated circuit chip 4.

In some embodiments, the chip on film includes a plurality of recesses 7 in an area proximal to the output bonding region 30. The chip on film is bendable along the row of the plurality of recesses 7, as indicated by a line 8 extending through the plurality of recesses 7 in FIG. 2B. The physical stress concentrated on the bent region when the chip on film is bent may be dissipated due to the presence of the plurality of recesses 7.

In some embodiments, the chip on film includes a plurality of grooves 7 in an area proximal to the output bonding region 30. The chip on film is bendable along the row of the plurality of grooves 7, as indicated by a line 8 extending through the plurality of grooves 7 in FIG. 2B. The physical stress concentrated on the bent region when the chip on film is bent may be dissipated due to the presence of the plurality of grooves 7.

The through holes, the recesses, and the grooves may have any appropriate shapes. Examples of appropriate shapes include, but are not limited to, a circular shape, a triangular shape, a rectangular shape, a square shape, etc.

Figure 3:
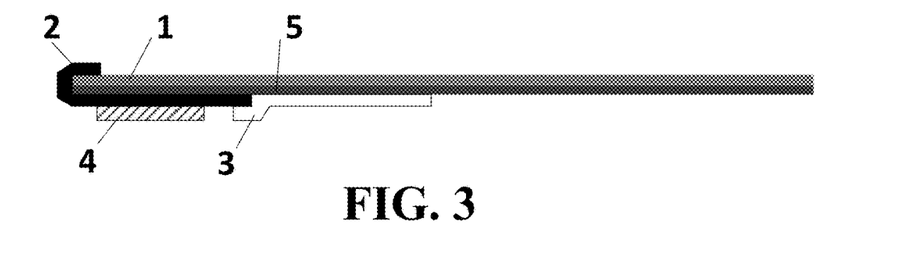
FIG. 3 is a diagram illustrating the structure of a flexible display apparatus in side view in some embodiments.

FIG. 3 is a diagram illustrating the structure of a flexible display apparatus in side view in some embodiments. Referring to FIG. 3, the flexible display apparatus in the embodiment includes a flexible display panel 1, a chip on film 2, and a flexible printed circuit board 3. The chip on film 2 includes an integrated circuit chip 4. Optionally, the flexible display apparatus further includes a heat insulating adhesive layer 5 between the flexible display panel 1 and the integrated circuit chip 4 as well as the printed circuit board 3. The heat insulating adhesive layer 5 protects the flexible display panel 1 by insulating the flexible display panel 1 from heat produced by the integrated circuit chip 4 as well as the printed circuit board 3.

Referring to FIG. 3, the output bonding region (not explicitly shown in FIG. 3) is mounted on a top surface of the flexible display panel 1, whereas the input bonding region, the integrated circuit chip 4, as well as the printed circuit board 3 are mounted on a bottom surface of the flexible display panel 1. The chip on film 2 is folded along a line formed by the row of the plurality of through holes (see, e.g., FIG. 2B) or a row of a plurality of recesses or grooves.

Figure 4:
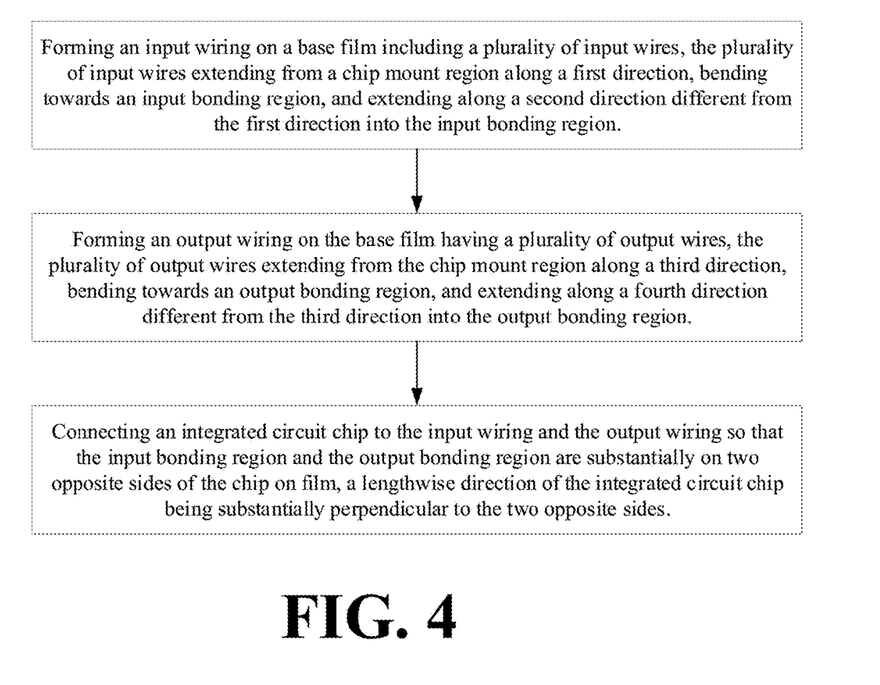
FIG. 4 is a flow chart illustrating a method of fabricating a chip on film in some embodiments.

FIG. 4 is a flow chart illustrating a method of fabricating a chip on film in some embodiments. Referring to FIG. 4, the method in the embodiment includes forming an input wiring on a base film having a plurality of input wires, the plurality of input wires extending from a chip mount region along a first direction, bending towards an input bonding region, and extending along a second direction different from the first direction into the input bonding region; and forming an output wiring on the base film having a plurality of output wires, the plurality of output wires extending from the chip mount region along a third direction, bending towards an output bonding region, and extending along a fourth direction different from the third direction into the output bonding region.

Optionally, the first direction and the third direction are substantially parallel to each other. Optionally, the second direction and the fourth direction are substantially parallel to each other. Optionally, the second direction and the fourth direction are substantially perpendicular to the first direction and the third direction.

In some embodiments, the method further includes connecting an integrated circuit chip to the input wiring and the output wiring so that the input bonding region and the output bonding region are substantially on two opposite sides of the chip on film, a longitudinal direction of the integrated circuit chip being substantially perpendicular to the two opposite sides. Optionally, the first direction and the third direction are substantially perpendicular to the longitudinal direction of the integrated circuit chip. Optionally, the second direction and the fourth direction are substantially parallel to the longitudinal direction of the integrated circuit chip.

In some embodiments, the method further includes forming a row of a plurality of through holes (or recesses or grooves) in an area of the base film proximal to the output bonding region. Optionally, the row of the plurality of through holes (or recesses or grooves) are in a direction substantially perpendicular to the fourth direction.

In another aspect, the present disclosure provides a method of fabricating a flexible display apparatus. In some embodiments, the method includes providing a chip on film described herein, and mounting an output bonding region of the chip on film to a flexible display panel bendable along a bending direction. Optionally, the chip on film includes a base film, an integrated circuit chip on the base film, an input wiring and an output wiring connected to the integrated circuit chip. The chip on film has an input bonding region for bonding with a printed circuit board and an output bonding region for bonding with a flexible display panel, and the input bonding region and the output bonding region are substantially on two opposite sides of the chip on film, a longitudinal direction of the integrated circuit chip being substantially perpendicular to the two opposite sides. The chip on film and the flexible display panel are connected in a way so that the longitudinal direction of the integrated circuit chip is substantially perpendicular to the bending direction. Optionally, the method further includes mounting the input bonding region of the chip on film to a printed circuit board.

In some embodiments, the method includes mounting the output bonding region on a top surface of the flexible display panel and mounting the integrated circuit chip and the input bonding region on a bottom surface of the flexible display panel. Optionally, the chip on film has a row of a plurality of through holes (or recesses or groves) in an area proximal to the output bonding region. Optionally, the method includes folding the chip on film along a line formed by the row of the plurality of through holes (or recesses or grooves).

Any appropriate insulating material may be used to make the base film. Examples of suitable base film materials include various insulating materials such as polyimide resin and polyester resin. Optionally, the base film has a thickness in the range of about 20 μm to about 100 μm.

Any appropriate conductive material may be used to make the wiring patterns. In some embodiments, the wiring patterns are made from a wiring layer. Optionally, the wiring layer has a thickness in the range of about 5 μm to about 20 μm. Optionally, the wiring layer is a metal foil of copper plated with tin, gold, nickel, or solder. The wiring layer may be formed by, e.g., casting, laminating, electroplating, etc. For example, in a casting method, a liquid base film is deposited onto a rolled copper foil and subsequently cured. In a laminating method, a rolled copper foil is placed on a base film for subsequent thermal compression. In an electroplating method, a copper seed layer is deposited on a base film, which is then immersed within a copper-containing electrolyte, thereby forming the copper foil when electricity is applied. Once the wiring layer is formed, the wiring pattern may be formed by various appropriate methods such as a patterning process using a photoresist.

In another aspect, the present disclosure provides a chip on film fabricated by a method described herein. In another aspect, the present disclosure provides a flexible display apparatus manufactured by a method described herein.

Examples of appropriate flexible display apparatuses includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A flexible display apparatus bendable along a bending direction extending from a first portion of the flexible display apparatus to a second portion of the flexible display apparatus; the first portion bent towards the second portion when the flexible display apparatus is bent along the bending direction; comprising:
   a plurality of chip on films arranged extending from the first portion to the second portion; each of the plurality of chip on films comprising a base film and an integrated circuit chip on the base film, each of the plurality of chip on films comprises an input wiring and an output wiring respectively connected to the integrated circuit chip;
   a printed circuit board connected to the input wiring; and
   a flexible display panel connected to the output wiring;
   wherein a longitudinal central axis of the integrated circuit chip is substantially perpendicular to the bending direction; and
   the input wiring is limited to be arranged on a first side with respect to the longitudinal central axis, and the output wiring is limited to be arranged on a second side with respect to the longitudinal central axis, the first side being opposite to the second side with respect to the longitudinal central axis.

2. The flexible display apparatus of claim 1, wherein each of the plurality of chip on films further comprises an input bonding region for bonding with the printed circuit board and an output bonding region for bonding with the flexible display panel;
   the input bonding region and the output bonding region are substantially on two opposite sides of a respective one of the plurality of chip on films;
   the longitudinal central axis of the integrated circuit chip is substantially perpendicular to the two opposite sides; and
   the input bonding region is limited to be arranged on the first side with respect to the longitudinal central axis, and the output bonding region is limited to be arranged on the second side with respect to the longitudinal central axis.

3. The flexible display apparatus of claim 2, wherein
   the input wiring comprises a plurality of input wires connecting the integrated circuit chip and the printed circuit board; the plurality of input wires extending from the integrated circuit chip along a first direction, bending towards the input bonding region, and extending along a second direction different from the first direction into the input bonding region;
   the output wiring comprises a plurality of output wires connecting the integrated circuit chip and the flexible display panel; the plurality of output wires extending from the integrated circuit chip along a third direction, bending towards the output bonding region, and extending along a fourth direction different from the third direction into the output bonding region; and
   the plurality of input wires are limited to be arranged on the first side with respect to the longitudinal central axis, and the plurality of output wires are limited to be arranged on the second side with respect to the longitudinal central axis.

4. The flexible display apparatus of claim 3, wherein the first direction and the third direction are substantially perpendicular to the longitudinal central axis of the integrated circuit chip, and the second direction and the fourth direction are substantially parallel to the longitudinal central axis of the integrated circuit chip.

5. The flexible display apparatus of claim 2, wherein each of the plurality of chip on films comprises a row of a plurality of through holes in an area proximal to the output bonding region.

6. The flexible display apparatus of claim 5, wherein the output bonding region is mounted on a first surface of the flexible display panel, and each of the plurality of chip on films is folded along a line formed by the row of the plurality of through holes so that the integrated circuit chip, the input bonding region, and the printed circuit board are mounted on a second surface of the flexible display panel opposite to the first surface.

7. The flexible display apparatus of claim 6, wherein the row of the plurality of through holes is substantially aligned in a direction substantially perpendicular to the longitudinal central axis of the integrated circuit chip.

8. The flexible display apparatus of claim 1, wherein the flexible display apparatus is curving around a curving axis, the plurality of chip on films arranged surrounding the curving axis when the flexible display apparatus is curved around the curving axis, and the longitudinal central axis of the integrated circuit chip is substantially parallel to the curving axis.

9. A chip on film, comprising a base film, an integrated circuit chip on the base film, an input wiring and an output wiring respectively connected to the integrated circuit chip;
   wherein the chip on film has an input bonding region for bonding with a printed circuit board and an output bonding region for bonding with a flexible display panel;
   the input bonding region and the output bonding region are respectively on two opposite sides of the chip on film, a longitudinal central axis of the integrated circuit chip being substantially perpendicular to each of the two opposite sides;

the input wiring and the input bonding region are limited to be arranged on a first side with respect to the longitudinal central axis; and the output wiring and the output bonding region are limited to be arranged on a second side with respect to the longitudinal central axis, the first side being opposite to the second side with respect to the longitudinal central axis;

the input wiring comprises a plurality of input wires extending from the integrated circuit chip along a first direction, bending towards the input bonding region, and extending along a second direction different from the first direction into the input bonding region;

the output wiring comprises a plurality of output wires extending from the integrated circuit chip along a third direction, bending towards the output bonding region, and extending along a fourth direction different from the third direction into the output bonding region; and the plurality of input wires are limited to be arranged on the first side with respect to the longitudinal central axis, and the plurality of output wires are limited to be arranged on the second side with respect to the longitudinal central axis;

wherein the first direction and the third direction are substantially perpendicular to the longitudinal central axis of the integrated circuit chip, and the second direction and the fourth direction are substantially parallel to the longitudinal central axis of the integrated circuit chip.

10. The chip on film of claim 9, further comprising a row of a plurality of through holes proximal to the output bonding region.

11. The chip on film of claim 10, wherein the chip on film is foldable along a line formed by the row of the plurality of through holes.

12. The chip on film of claim 11, wherein the row of the plurality of through holes is substantially aligned in a direction substantially perpendicular to the longitudinal central axis of the integrated circuit chip.

13. A method of fabricating a flexible display apparatus, comprising:

providing a chip on film comprising a base film, an integrated circuit chip on the base film, an input wiring and an output wiring respectively connected to the integrated circuit chip; wherein the chip on film has an input bonding region for bonding with a printed circuit board and an output bonding region for bonding with a flexible display panel; the input bonding region and the output bonding region are substantially on two opposite sides of the chip on film, a longitudinal central axis of the integrated circuit chip being substantially perpendicular to the two opposite sides; and mounting the chip on film to the flexible display panel bendable along a bending direction so that the longitudinal central axis of the integrated circuit chip is substantially perpendicular to the bending direction;

wherein the bending direction extends from a first portion of the flexible display panel to a second portion of the flexible display panel; the first portion bent towards the second portion when the flexible display panel is bent along the bending direction; and the input wiring is limited to be arranged on a first side with respect to the longitudinal central axis, and the output wiring is limited to be arranged on a second side with respect to the longitudinal central axis, the first side being opposite to the second side with respect to the longitudinal central axis.

14. The method of claim 13, further comprising mounting the output bonding region on a first surface of the flexible display panel; and mounting the integrated circuit chip and the input bonding region on a second surface of the flexible display panel opposite to the first surface.

15. The method of claim 14, wherein the chip on film comprises a row of a plurality of through holes in an area proximal to the output bonding region, the method further comprising folding the chip on film along a line formed by the row of the plurality of through holes.

* * * * *